United States Patent
Colton et al.

[11] 3,961,352
[45] June 1, 1976

[54] MULTI-RIPPLE CHARGE COUPLED DEVICE

[75] Inventors: Douglas Roy Colton, Kanata; Stanley Daniel Rosenbaum, Ottawa, both of Canada

[73] Assignee: Northern Electric Company Limited, Montreal, Canada

[22] Filed: May 30, 1975

[21] Appl. No.: 582,276

[52] U.S. Cl............................. 357/24; 307/221 D; 307/304; 357/59
[51] Int. Cl.²................... H01L 29/78; H03K 3/353
[58] Field of Search....... 357/24; 307/221 C, 221 D, 307/304

[56] References Cited
OTHER PUBLICATIONS

Collins et al. "CCD Memory options" IEEE Int. Solid State Circuits Conf. 1973, Dig. Tech. Papers pp. 136, 137, 210.

D. Baetsch et al. "The Pluses and Minuses of Charge Transport Devices" Electronics (Dec. 6, 1971) pp. 86–91.

W. Kosonocky et al. "Two-Phase Charge-coupled Devices with overlapping polysilicon and Aluminum Gates" RCA Review vol. 34 (Mar. 19, 1973) pp. 165–202.

M. Tompsett et al. "Charge Coupled 8-Bit Shift Register" Applied Physics Letters (Aug. 8, 1970) vol. 17, pp. 111–115.

Primary Examiner—Stanley D. Miller, Jr.
Assistant Examiner—Gene M. Munson
Attorney, Agent, or Firm—John E. Mowle

[57] ABSTRACT

A charge coupled device that provides approximately a fifty per cent increase in storage capacity over the conventional two-phase device by utilizing a multi-ripple technique in which charges are simultaneously stored under three out of every four storage control electrodes.

3 Claims, 4 Drawing Figures

MULTI-RIPPLE CHARGE COUPLED DEVICE

This invention relates to a charge coupled device and more particularly to one which provides improved storage capacity by utilizing a multi-ripple transfer technique.

BACKGROUND OF THE INVENTION

In an article entitled: "Charge-Coupled Devices-A New Approach to MIS Device Sructure" IEEE Spectrum, July 1971, pp 18–27; W. S. Boyle and G. E. Smith describe a new information-handling structure, the charge coupled device (CCD). The device, which may be of the metal-oxide-semiconductor (MOS) type, stores a minority-carrier charge in potential wells created at the surface of a semiconductor and transports the charge along the surface by the application of bias potentials to move the potential wells. The charge tends to decay after a relatively short period of time due to thermal effects and consequently must be periodically regenerated by known means. In addition to the semiconductor type utilizing minority-carrier charge transport, CCDs have also been constructed using a semi-insulating material where the charge transport is via majority carriers.

An important consideration of any CCD is the storage efficiency. In a conventional two-phase CCD, two storage electrodes are required per bit, in a three-phase device three storage electrodes are required, in a four-phase device again two storage electrodes are required per bit. Such structures are rather inefficient in terms of storage capacity yielding a maximum of only 50% for a two-phase device. In a paper entitled: "CCD Memory Options" by D. R. Collins, J. B. Barton, D. C. Buss, A. R. Kmetz and J. E. Schroeder, 1973 *IEEE International Solid-State Circuits Conference-Digest of Technical Papers*, pp 136 et seq; FIG. 4 illustrates an alternate approach. Here, there is shown the conceptual organization of a full-ripple CCD in which charges are stored beneath all but one of the electrodes. Each charge in turn is sequentially transferred in ripple fashion into an adjacent empty location which thus propagates in the opposite direction to the flow of charges along the device. However, a realizable structure of this concept raises severe problems. Since only one charge transfer can take place at any one instant in time, a CCD with a storage capacity of $n$-bits must be driven by an $(n+1)$ phase clock. In large storage capacity CCDs (i.e. those containing upwards of 100 storage elements) this virtually rules out the use of a multi-phased clock which is individually coupled to each field plate utilizing separate conductive drive lines, due to the complexity of such a structure as well as the clock itself. An alternate solution would be to drive the CCD chain utlizing a $(n+1)$ bit FET shift register which is connected in parallel with the CCD. However such an arrangement also requires that an individual, separate connection be made to each storage electrode, is costly in terms of space and increases the complexity of the transistor circuitry forming part of the overall device.

Typically, in a two-level CCD the field plates of each level measure $8\mu m$ in the direction of charge flow separated by a gap between adjacent electrodes of $4\mu m$ thus yielding a $2\mu m$ overlap on each side of the upper and lower levels. If a structure of these dimensions is to be used as a multi-ripple device, it is necessary to bond the ends of each of the field plates to different conductive drive lines which couple the clock voltages to the device. However, at the present state of the art, these dimensions are too small to insure sufficient overlap of the bonding areas and hence it is necessary to provide contact pads having almost twice the width (typically $14\mu m$) of the field plates. However, because of the width and close spacing between the electrode plates, these pads introduce additional structural problems in the realization of a practical design, in view of their size and the limited width available between plates.

STATEMENT OF THE INVENTION

The present invention is a multi-ripple charge coupled device which overcomes these structural limitations yet provides approximately 50% increase in storage capacity over conventional two-phase, three-phase or four-phase devices without the attendant problems associated with a full-ripple CCD. Thus, in accordance with the present invention there is provided a charge storage body having a row of alternately lower and upper elongated conductive field plates laterally disposed on an insulating layer over the body. Each of the upper field plates overlaps the two adjacent lower field plates. In addition, the device comprises two sets of conductive feed lines which are contiguously disposed on the insulating layer along opposite sides of the row. The feed lines are used to connect clock voltages to the plates to control the transfer of discrete charges therebeneath along the row of the charge storage body. Each of the feed lines is periodically connected to the ends of the elongated conductive field plates. Each of the field plates is connected to its associated feed line through a contact pad that is approximately twice the width of the field plate. In order to structurally separate the pads, they project from the field plates along the row, in a direction that avoids overlap with immediate adjacent field plates.

As detailed above, the major increase in storage capacity is achieved by using a multi-ripple transfer structure. In a preferred form a charge coupled device is realized as a fourfold-ripple structure. With this arrangement, bias voltages are applied to store charge under three out of every four lower field-plates thus yielding virtually a 50% increase in the storage capacity over the conventional two-phase device in which at any instant in time, charge is stored under every second lower field plate.

BRIEF DESCRIPTION OF THE DRAWINGS

An example embodiment of the invention will now be described with reference to the accompanying drawings in which.

DESCRIPTION OF THE PREFERRED EMBODIMENT

Figure 1:
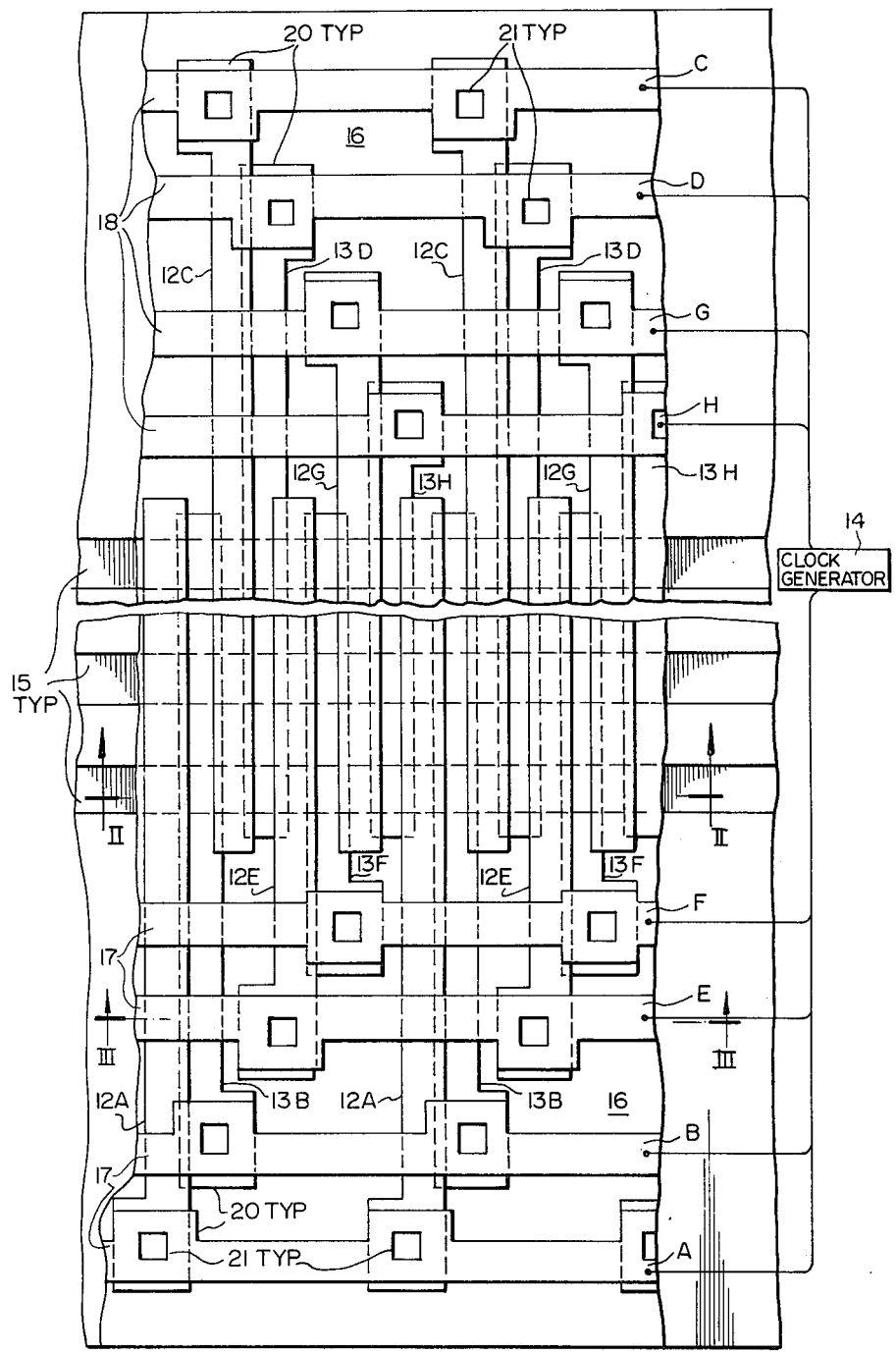
FIG. 1 is a plan view of a typical portion of a fourfold-ripple charge coupled device constructed in accordance with the present invention.

The fabrication of the charge coupled device described herein utilizes technologies well established and known in the semiconductor field. It is therefore considered unnecessary to describe in detail the individual steps for forming the device. However, Canadian Pat. No. 941,072 issued Jan. 29, 1974 to James J. White, describes one method of constructing a two-level poly-silicon charge coupled device which is the basic structure of the device disclosed herein. Also, it is evident that the figures shown in the drawings are exemplary of the construction of the invention and are not necessarily drawn to scale.

In the following detailed description and accompanying drawings, basic reference numbers will be assigned to individual elements of the device. Where it is necessary to distinguish between repetitive elements in a row, additional reference characters will be added to the base number. In general, reference will be made only to the base number.

Figure 2:
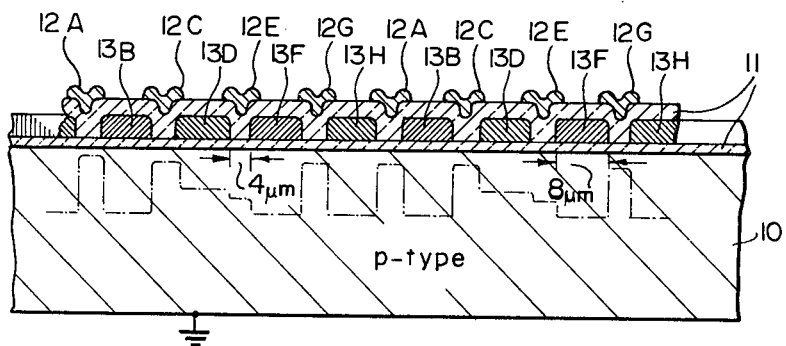
FIG. 2 is a cross-sectional view of the fourfold-ripple charge coupled device taken along the lines II—II of FIG. 1.

Referring to FIGS. 1 and 2, the fourfold-ripple charge coupled device comprises a p-type silicon substrate 10 having a variable thickness silicon dioxide insulating layer 11 deposited thereof. A row of alternately upper 12 and lower 13 elongated poly-silicon conductive field plates laterally disposed so as to overlap adjacent ones thereto, have been deposited on the insulating layer 11. As will be manifest hereinafter, the lower field plates 13 function as storage control electrodes while the upper field plates 12 function as transfer gates in a well known manner.

As shown in FIG. 1, the silicon dioxide insulating layer 11 includes a plurality of gate oxide regions 15 beneath which the packets of charge are transferred along the row under control of clock voltages applied to the field plates 12 and 13 from a clock generator 14. These gate oxide regions 15 consist of alternating thicknesses of insulating layer 11 which is approximately 1100A thick under the storage electrodes 13 and 3000A thick under the transfer electrodes 12. The thicker portions in between are designated as field oxide regions 16. These latter regions 16 are sufficiently thick (approximately $1.2\mu m$) that the portions of the semiconductor substrate 10 immediately beneath them do not invert in response to the application of clock voltages to the field plates 12 and 13. Consequently the minority-carrier charges are only carried along the substrate 10 immediately adjacent the gate oxide regions 15.

Along each side of the row of upper and lower field plates 12 and 13 is a set of four aluminum conductive feed lines 17 and 18. One end of each of the field plates 12 and 13 terminates in a contact pad 20 which overlaps a corresponding pad periodically spaced along the conductive feed lines 17 or 18. These pads 20 are necessary because of the relatively small size of the device to insure sufficient overlap so that windows 21 which are formed in the pads 20 during construction of the device will provide contact between the poly-silicon plates 12 and 13 and the aluminum feed lines 17 and 18. While only three gate oxide regions 15 are illustrated in FIG. 1, a high capacity CCD would contain a much larger number, e.g. upwards of 50, so that the eight conductive feed lines 17 and 18 would occupy a relatively small portion of the total area of the device.

Figure 3:
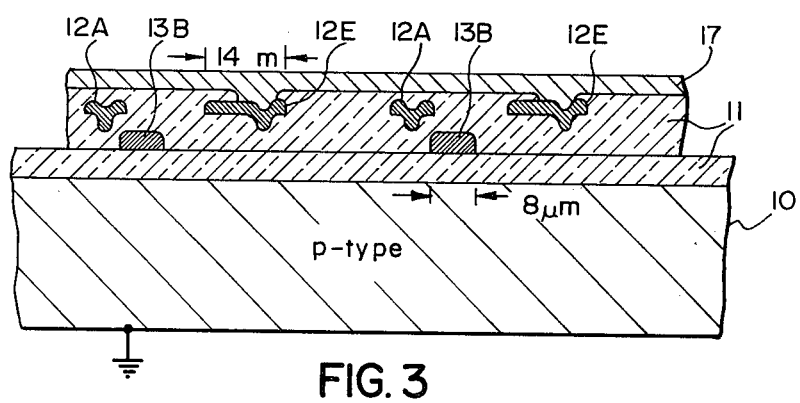
FIG. 3 is a cross-sectional view of the fourfold-ripple charge coupled device taken along the lines III—III of FIG. 1.

Referring more specifically to FIG. 2, a typical CCD of the present invention has plates 12 and 13 which measure $8\mu m$ in the direction of charge flow that are separated from each other by a gap of $4\mu m$ thus providing a $2\mu m$ overlap between adjacent field plates. Since these dimensions are insufficient to assure proper overlapping contact between the plates 12 and 13 and the conductive feed lines 17 and 18, with today's technology, the pads 20 must be made almost twice as wide ($14\mu m$) as the plates, as illustrated in FIG. 3. However, this poses the additional problem of providing a structure in which the increased width of the pads 20 does not result in interference with the windows 21 of the adjacent plates. This problem has been overcome in the present invention by displacing the pads 20 of each pair of plates 12A–13B; 12C–13D; 12E–13F; and 12G–13H; in opposite directions along the row; and by alternately connecting the adjacent pairs of plates 12A–13B; 12C–13D; 12E–13F; and 12G–13H; to the conductive feed lines 17–18 on opposite sides of the row. Thus the first pair of plates 12A–13B have opposed pads 20 connected to two of the feed lines 17 on one side of the row and the next pair of plates 12C–13D have opposed pads 20 connected to two of the feed lines 18 on the opposite side of the row. The next pair of plates 12E–13F have opposed pads connected to two of the feed lines 17 on the first side of the row while the last pair of plates 12G–13H have pads 20 connected to two of the conductive feed lines 18 on the opposite side. The structure is then repeated along the length of the row.

Figure 4:
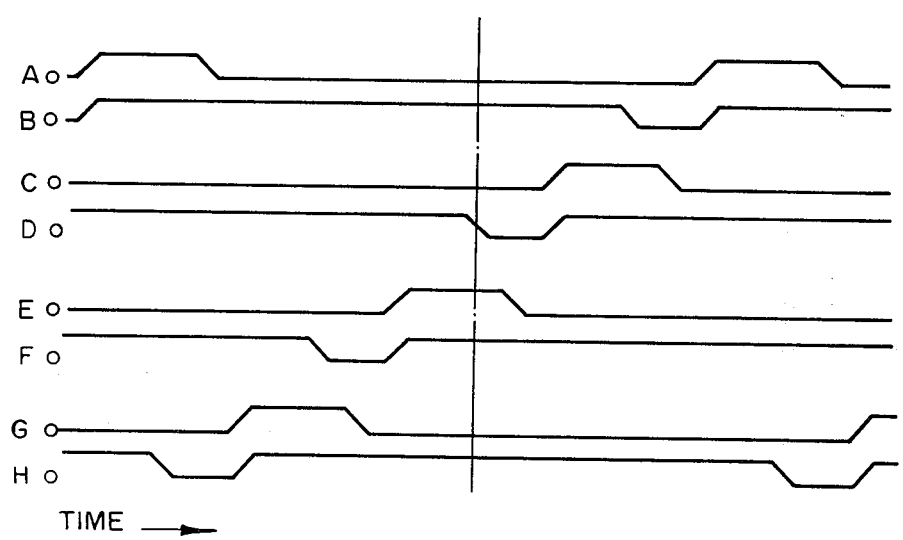
FIG. 4 is a diagram of the typical clock voltages used to drive the fourfold-ripple charge coupled device illustrated in FIGS. 1 to 3.

FIG. 4 illustrates typical clock voltages generated by the clock generator 14 and used to drive the fourfold-ripple charge coupled device to transfer charges by the "full bucket" technique as opposed to the "difference bucket technique". The individual waveforms identified by reference characters A to H are applied to the conductive feed lines 17 and 18 bearing the corresponding reference characters in FIG. 1. FIG. 4 illustrates positive clock voltages which are used for an n-channel device. It will be evident that if an n-type substrate is used with p-channel technology the polarity of the clock voltages would be reversed. A nominal clock voltage of +10 volts is utilized for both the transfer gates 12 and the storage electrodes 13.

The broken line illustrated in FIG. 4 indicates the clock voltages at the point in time where charge is being transferred from beneath the storage electrodes 13D to 13F. Just prior to this point in time, positive clock voltages are being applied to all storage electrodes 13B, 13D, 13F and 13H. However, only three electrodes 13B, 13D and 13H have potential charges stored thereunder; the fourth 13F is empty. The application of the clock voltage to transfer gate 12E and the reduction of voltage on storage electrode 13D transfers any charge beneath storage electrode 13D to beneath 13F. The dotted line in FIG. 2 illustrates pictorially the depth of the potential wells at this instant. Shortly thereafter any potential charge beneath storage electrode 13B is transferred to the now empty storage well beneath electrode 13D. From this it is evident that at any one instant in time charge is being stored under three out of every four electrodes 13. By storing charge beneath three out of four of the storage electrodes, the storage density is approximately 50% greater than for the conventional two-phase or four-phase devices. In addition, power required to drive the device is lowered by a factor of about one-third because of the smaller overall storage area and therefore the clock capacitance is reduced by the same factor.

It will be evident that the principles taught herein can be applied to alternate arrangements having differing numbers of consecutive field plates 13 beneath which charge is stored with the total number of feed lines on both sides of the row being $2n + 6$, where $n$ is a natural number.

While not illustrated, conventional input and output techniques are utilized for coupling charges to and from the device.

What is claimed is:

1. A charge coupled device comprising:

a charge storage body;

a row of alternately lower and upper elongated conductive field plates laterally disposed on an insulating layer over said body, each upper field plate overlapping the two adjacent lower field plates;

conductive feed lines contiguously disposed on said insulating layer along the sides of said row; the row being divided into sequential groups of at least four consecutive lower field plates and four consecutive upper field plates, each conductive feed line being connected in each of the sequential groups to a correspondingly located field plate;

means for applying clock voltages to the feedlines of said lower field plates to create potential wells in the charge storage body beneath said lower field plates for the simultaneous storage of charge in all but one of the potential wells in each group, and for sequentially altering the clock voltages applied to the feedlines of the lower and upper field plates in one direction to stepwise transfer charge in an adjacent potential well to said one potential well in the opposite direction.

2. A charge coupled device as defined in claim 1 in which:

the total number of feed lines on both sides of the row is equal to $2n + 6$, where $n$ is a natural number.

3. A charge coupled device as defined in claim 1 in which:

the means for sequentially altering the clock voltages applied to the feedlines comprises:

initially applying a clock voltage to an upper field plate to open a channel between said one potential well and said adjacent potential well in the charge storage body, and thence removing a clock voltage from a lower plate to collapse said adjacent potential well and thereby transfer charge to said one potential well.

* * * * *